(12) United States Patent
Evans

(10) Patent No.: US 8,344,925 B1
(45) Date of Patent: Jan. 1, 2013

(54) SYSTEM AND METHOD FOR ADAPTIVE TIMING CONTROL OF SUCCESSIVE APPROXIMATION ANALOG-TO-DIGITAL CONVERSION

(75) Inventor: William Pierce Evans, Catonsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 112 days.

(21) Appl. No.: 13/116,497

(22) Filed: May 26, 2011

(51) Int. Cl.
*H03M 1/12* (2006.01)

(52) U.S. Cl. ........ 341/155; 341/118; 341/120; 341/164; 341/165; 341/166

(58) Field of Classification Search .......... 341/118–121, 341/155, 164–166, 172
See application file for complete search history.

(56) References Cited

U.S. PATENT DOCUMENTS

| | | | | |
|---|---|---|---|---|
| 5,675,340 A * | 10/1997 | Hester et al. | ................... | 341/156 |
| 6,351,231 B1 * | 2/2002 | Price et al. | .................... | 341/155 |
| 6,958,722 B1 * | 10/2005 | Janakiraman et al. | ........ | 341/161 |
| 7,170,439 B1 * | 1/2007 | Chen | ............................. | 341/172 |
| 7,212,143 B1 * | 5/2007 | Confalonie | ................... | 341/155 |
| 7,265,694 B2 * | 9/2007 | Guidry | .......................... | 341/120 |
| 7,286,075 B2 * | 10/2007 | Hennessy et al. | ............. | 341/172 |
| 7,408,490 B2 * | 8/2008 | Melanson et al. | ............ | 341/120 |
| 7,576,678 B2 * | 8/2009 | Chatal et al. | ................... | 341/163 |
| 7,839,319 B2 * | 11/2010 | Nittala et al. | ................. | 341/162 |
| 7,924,205 B2 * | 4/2011 | Yoshinaga | ..................... | 341/161 |
| 8,081,097 B2 * | 12/2011 | Hsu | ............................... | 341/120 |

* cited by examiner

*Primary Examiner* — Linh Nguyen
(74) *Attorney, Agent, or Firm* — Rosenberg, Klein & Lee

(57) ABSTRACT

A system and method are provided for adaptively controlling timing in SAR ADC of a sampled analog signal within a conversion period. A state machine maintains a set of SAR states including a sampling state and a plurality of bit conversion states. A reference generator generates a quantization level reference for each of the bit conversion states within a parametric settling time thereof. A comparator compares the sampled analog signal with the quantization level reference over a parametric propagation time for determining a hit value for each hit conversion state. A clock generator adaptively defines signals for clocking the state machine and comparator for each SAR state, thereby adaptively delaying bit determination in each bit conversion state by an integration period not less than the settling time, while adaptively delaying quantization level reference generation for a next bit conversion state by a regeneration period not less than the propagation time.

28 Claims, 11 Drawing Sheets

SYSTEM AND METHOD FOR ADAPTIVE TIMING CONTROL OF SUCCESSIVE APPROXIMATION ANALOG-TO-DIGITAL CONVERSION

BACKGROUND OF THE INVENTION

The present invention is generally directed to a system and method for timing generation in successive approximation register (SAR) analog-to-digital conversion. More specifically, the subject system and method provide for selective generation of a timing profile used in actuating an SAR analog-to-digital converter ADC.

SAR ADC architecture has long been favored in many applications requiring high speed, low power consumption, and suitably high conversion resolution. For conversion to an n-bit digital word, an SAR ADC generally operates to sample an analog input signal voltage then carry out a binary search for the corresponding quantized level to be coded via the n-hit word. The binary search is carried out over each of the bit positions in the n-bit word, with a comparator comparing the sampled input signal voltage against a succession of voltage reference levels. This comparison is thereby made for each successive "state" of the n-bit word as it is updated bit-by-bit in a successive approximation register.

The voltage reference levels for the states are successively provided according to an SAR state machine. The levels are set for each state by an internal reference digital-to-analog converter (DAC) relative to a supply voltage $V_{IF}$. For each state, the SAR state machine prescribes the voltage reference level according to the quantization value then defined by the n-bit digital word.

An SAR ADC processing cycle thus includes a sampling phase followed by a conversion phase, during which a series of bit determinations are successively made. This cycle is repeated for subsequent samples of the input analog signal.

With ongoing advances in device technologies, there is ever increasing demand for greater speed in such processing. For deep submicron semiconductor technologies, for instance, it is a significant challenge to preserve ample timing for full and proper execution of SAR ADC processing cycles.

Attempts have been made in the art to optimize the timing generated for SAR ADC processing. In one self-timed approach, the SAR ADC detects when the comparator ompletes a comparison for bit determination in the current state, then automatically initiates the next state for the determination of the following bit. While such approaches do improve timing efficiencies, they do not ensure ample allocation of the available SAR processing cycle time between the sampling and conversion phases (successive bit determinations) of each cycle.

What is more, the internal reference DAC of an SAR ADC invariably exhibits a non-trivial settling time between bit determinations. This settling time varies with the prevailing conversion rate, process corner, and such environmental factors as temperature. The known attempts to optimize timing fail to ensure adequate time for settling of the internal reference DAC between successive bit determinations. There is therefore a need for a system and method which overcomes such deficiencies, and optimally generates the timing required for full and proper SAR ADC processing.

SUMMARY OF THE INVENTION

It is an object of the present invention to provide a system and method which automatically generate ample timing for full and proper execution of SAR ADC processing cycles.

It is another object of the present invention to provide a system and method which ensure ample allocation of available SAR processing cycle time between the sampling and bit conversion phases of each cycle.

It is yet another object of the present invention to provide a system and method which enables selectivity over the timing generated for SAR ADC processing cycles.

These and other objects are attained in a system formed in accordance with the present invention for adaptive timing control in successive approximation analog-to-digital conversion of a sampled analog signal within a conversion period. The system comprises a state machine unit operating responsive to a state clocking signal to maintain a set of successive approximation states, which include at least one sampling state and a plurality of bit conversion states. A reference generating unit is operably coupled to the state machine unit, and operates to generate a quantization level reference for each of the bit conversion states. A comparator unit is operably coupled to the state machine and reference generating units, and executes responsive to a comparator clocking signal to compare the sampled analog signal with the quantization level reference for determining a bit value during each bit conversion state. A clock generator unit is operably coupled to the state machine and comparator units, and operates responsive to a triggering signal to adaptively define the state and comparator clocking signals for each of the successive approximation states. The clock generator unit thereby adaptively delays execution of the comparator unit in each bit conversion state until the reference generating unit substantially completes generation of the quantization level reference therefor.

The various objects of the present invention are also attained in a system implemented in accordance with the present invention for adaptively controlling timing in successive approximation analog-to-digital conversion of a sampled analog signal within a conversion period. Such system comprises a state machine unit operating responsive to a state clocking signal to maintain a set of successive approximation states responsive to a state clocking signal, the successive approximation states including at least one sampling state and a plurality of bit conversion states. A reference generating unit is operably coupled to the state machine unit, which generates a quantization level reference for each of the bit conversion states within a parametric settling time thereof, A comparator unit is operably coupled to the state machine and reference generating units, which executes responsive to a comparator clocking signal to compare the sampled analog signal with the quantization level reference for determining a bit value for each hit conversion state over a parametric propagation time. A clock generator unit is operably coupled to the state machine and comparator units. The clock generator unit operates responsive to the triggering signal to adaptively define the state and comparator clocking signals for each of the successive approximation states. The clock generator includes mutually responsive integration and clock setting portions. The reconfigurable integration portion selectively delays execution of the comparator comparison in each hit conversion state by an integration period not less than the parametric settling time; while the clock setting portion adaptively delays generation of the quantization level reference for a next of the bit conversion states by a regeneration period of not less than the parametric propagation time following a current one of the bit conversion states.

In certain embodiments, a system provided in accordance with the present invention further comprises a sample duty cycle control unit for adjustably actuating the clock generator unit to selectively set a duty cycle defining a relative portion of the conversion period allocated to the sampling state. In certain other embodiments, the sample duty cycle control realized thereby includes adjustably scaling the integration period defined by the clock generator unit for each of the bit conversion states.

The various objects of the present invention are further attained in a method implemented in accordance with the present invention for adaptively controlling timing in successive approximation analog-to-digital conversion of a sampled analog signal within a conversion period. The method comprises executing a state machine to initialize and update a set of successive approximation states responsive to a triggering signal and a state clocking signal, wherein the successive approximation states include at least one sampling state and a plurality of bit conversion states. A reference generator is executed to generate a quantization level reference for each of the bit conversion states within a parametric settling time thereof. A comparator is executed responsive to a comparator clocking signal to compare the sampled analog signal with the quantization level reference for determining a hit value for each bit conversion state over a parametric propagation time. A clock generator is operated responsive to the triggering signal to adaptively define the state and comparator clocking signals for each of the successive approximation states. The clock generator thereby adaptively delays execution of the comparator comparison in each bit conversion state by an integration period not less than the parametric settling time, while adaptively delaying generation of the quantization level reference for a next bit conversion state by a regeneration period of not less than the parametric propagation time following a current hit conversion state.

In certain embodiments, the method includes adjustment of the clock generator over the successive approximation states to selectively define the integration period for one or more of the bit conversion states. In certain other embodiments, the method includes sample duty cycle control for adjustably actuating the clock generator to selectively set a duty cycle defining a relative portion of the conversion period allocated to the sampling state. In still certain other embodiments, such sample duty cycle control includes adjustably scaling the integration period defined for each of the bit conversion states.

BRIEF DESCRIPTION OF THE DRAWINGS

HG. 1 is a schematic block diagram illustrating an interconnection of operational units in a system formed in accordance with an exemplary embodiment of the present invention.

DETAILED DESCRIPTION OF THE PREFERRED EMBODIMENTS

Figure 1:
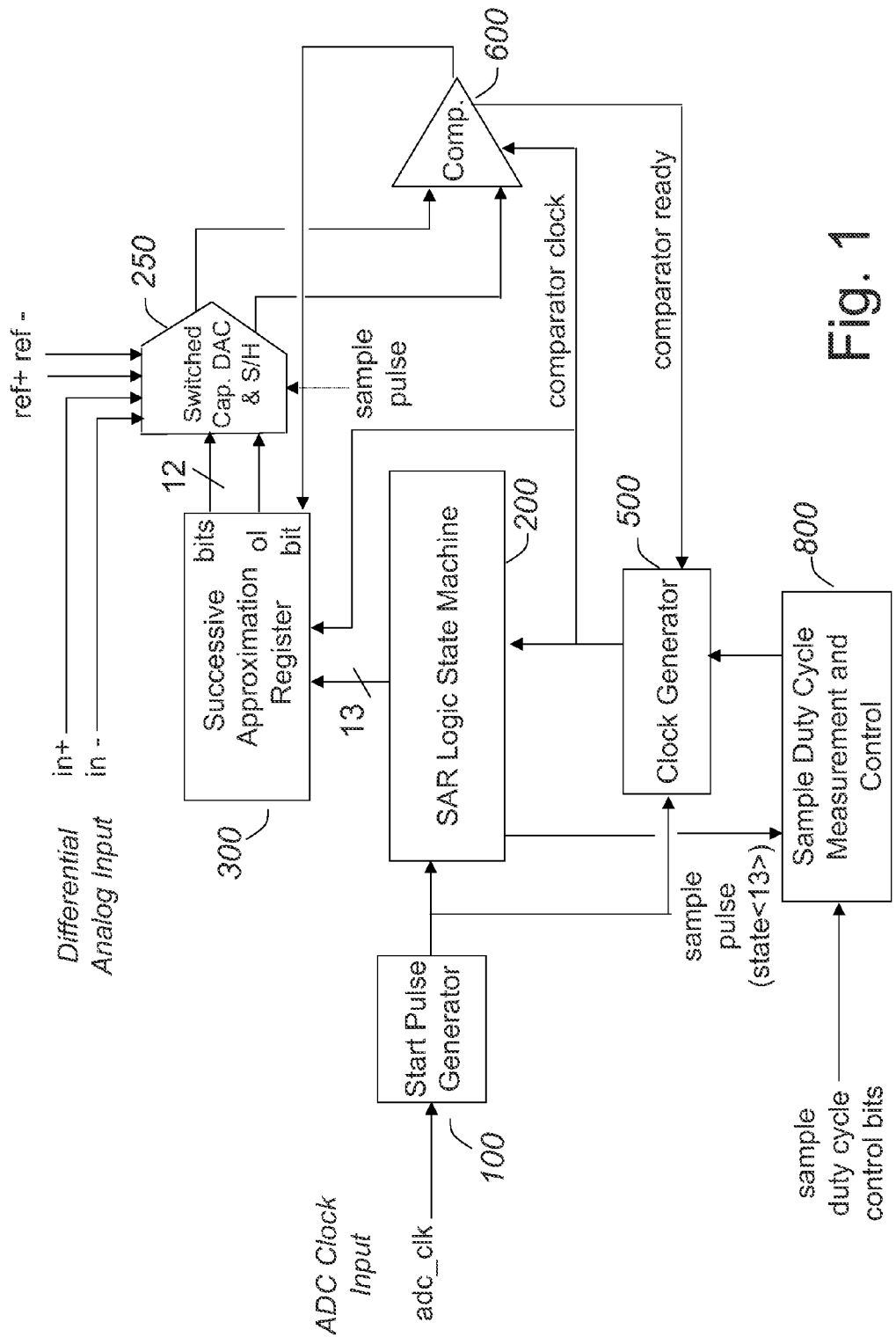

Referring now to FIG. 1, there is shown a system 10 formed in accordance with an exemplary embodiment of the present invention. System 10 generally provides a successive approximation register (SAR) analog-to-digital converter (ADC) with adaptive timing generation. SAR ADC processing is effectively carried out by a system 10 which includes a SAR logic state machine unit 200, successive approximation register (SA Register) unit 300, reference digital-to-analog DAC converter & sample/hold (S/H) unit 250, and comparator unit 600 preferably inter-coupled as shown. Although separately shown, the successive approximation register of unit 300 may be formed as part of SAR logic state machine unit 200.

Timed SAR ADC

As mentioned, an SAR ADC processing cycle includes a sampling phase followed by a bit conversion phase. During the sampling phase, reference DAC & S/H unit 250 samples and holds (for the subsequent bit conversion phase) an analog input voltage $V_{IN}$, which in the illustrated example happens to be of differential voltage type. During the bit conversion phase which follows, a series of bit determinations are successively made to arrive at the converted digital word for the sampled analog voltage $V_{IN}$. This processing cycle is repeated for subsequent samples of the input analog signal.

Each SAR ADC processing cycle is actuated according to an input ADC clock signal adc_clk. Preferably, the sampling phase of a cycle is carried out during a first logic state of the ADC clock signal, while the conversion phase is carried out Once the ADC clock signal transitions to a second logic state. The Start pulse generator unit 100 preferably operates responsive to a transition (edge detection) in the input ADC clock signal adc_clk to provide a start pulse. This then triggers the conversion phase of SAR ADC processing, the sampling phase having already been carried out before the ADC clock signal's transition. Such timing for each SAR ADC processing cycle is controlled in accordance with certain aspects of the present invention by the combination of a clock generator unit 500 and a sample duty cycle measurement and control unit 800 operably coupled thereto.

SAR logic state machine unit 200 operates generally to keep track of when the system is in sampling phase and when it is in bit conversion phase. State machine unit 200 actuates the conversion phase of the processing cycle upon triggering by the start pulse. The particularities of this start pulse—its polarity, duration, amplitude, and the like—may be suitably set depending on the particular requirements of the intended application. Through the conversion phase, SAR logic state machine unit 200 successively determines and stores each bit of a digital word of predetermined bit length n in SA Register unit 300. This is carried out through a corresponding number of states, preferably beginning with the most significant bit (MSB) of the n-bit digital word, successively on down to the least significant bit (LSB).

In the embodiment shown, an additional intermediate state is processed to account for an overlap bit in a suitable manner known in the art. Use of the overlap bit preferably serves to reduce settling time requirements. Suitable measures known in the art may be taken to accommodate this overlap bit, as its use invariably changes the timing requirements in a more complex manner as the ADC state machine proceeds from state to state than a converter without this overlap bit.

SAR logic state machine unit 200 thus operates to actuate a binary search for the n-bit quantized level closest to the sampled $V_{IN}$, relative to a predetermined reference voltage. The sampled voltage $V_{IN}$ is compared during the binary search against respective voltage reference levels set according to a series of quantization values, as coded by the n-bit digital word over successive states, in this regard, the system employs a comparator unit 600 coupled to receive from reference DAC & S/H unit 250 the sampled $V_{IN}$ at one input and the internal reference voltage for each successive state. Comparator unit 600 is clocked to compare these signals at each state, and the digital word in the SA Register unit 300 is accordingly updated based on the comparison result.

To convert the sampled voltage $V_{IN}$ to an n-bit digital word, such comparisons are carried out over a series of at least n successive states for each of the n-bits. In the illustrated embodiment, the comparison is made for an additional intermediate state so as to accommodate the overlap bit. The n-bit reference DAC of unit 250 may be of any suitable type known in the art (for example, a capacitive DAC) and operates according to reference supply voltage $V_{REF}$ (defined across terminals ref+ and ref− in the embodiment shown). The reference DAC preferably sets the internal reference voltage for each sta of processing at a voltage level relative to $V_{REF}$, in scaled proportion to the coded value of the n-bit digital word (SAR word) then set for the given state (relative to the maximum coded value).

The conversion phase preferably begins with the SAR logic state machine unit 200 clearing then initializing the SA register unit 300 to its $(n+1)^{th}$ state (or $n^{th}$ state, if no overlap bit is used). That is, all but the $n^{th}$, or most significant, bit of the stored digital word is cleared to its logic low value. The resulting n-bit SAR digital word, having just its MSB set to a logic high value, is passed to the reference DAC of unit 250 which generates a voltage quantization reference level $V_{DAC}(n)$ for this $n^{th}$ state by correspondingly scaling $V_{REF}$ according to the coded modular value of the n-bit digital word in the SA register at this state. Depending on the comparison of the sampled input voltage $V_{IN}$ with the reference level $V_{DAC}(n)$, the logic high value set for the $n^{th}$ bit of the SAR word by the SAR logic state machine is either kept at that logic value or reset to its logic low value.

SAR logic state machine unit 200 successively moves on through the remaining states, carrying out much the same operation for each SAR state from the next state on down until the LSB is reached and suitably processed. For each successive SAR state, the state's corresponding bit in the n-bit SAR word is set to its logic high value while all the lesser significant bits therefrom are maintained at their logic low values. The reference level $V_{DAC}(i)$ for each successive state, or bit position, i is selectively set according to the coded value of the digital word then stored in the SA register. The effect of this is to approximate the quantization level for $V_{IN}$ in successively closer increments to converge at its digital conversion, namely the n-bit word remaining in the SA register after due processing of all states.

The embodiment illustrated in FIG. 1 is configured to provide, for example, a 12 bit SAR ADC, with an overlap bit. The conversion phase comprises in this case 13 bit conversion states <12>, . . . , <0>. This is in addition to the preceding sampling phase, of course, which may be considered a separate $14^{th}$ state, state <13>, of a processing cycle. In any event, the bit conversion phase begins with state <12> where the MSB of the SAR word is determined by the reference DAC setting the appropriate reference value, with the comparator then comparing the sampled $V_{IN}$ to that reference value. The states count down in order from there, with the next six less significant bits of the SAR word being successively determined in states <11> through <7>, preferably until state <6> is reached. In that state, the overlap bit is determined, after which the conversion phase continues to successively determine the next six bits in states <5> through <0>, the LSB being determined at state <0>.

During each of these bit conversion states, the reference DAC of unit 250 is afforded sufficient time to settle on the appropriate reference level for comparison before the comparator is clocked to compare the sampled $V_{IN}$ thereto. Since reference DAC circuits/devices typically exhibit considerable settling time, and since such circuits/devices are prone to settling time variation due to factors like conversion ra process corner, and environmental conditions, it is important that ample time be allotted before each occurrence of comparator clocking.

When comparator unit 600 is clocked in state <12> of the conversion phase of processing, the MSB of the SAR word is either kept value 1 or set back to value 0 depending on the comparator output. State machine unit 200 then moves on to the next state <11>, where the next bit (MSB-1) is set to value 1, and the reference DAC is given time to settle to the appropriate voltage level to serve as a comparison reference for the SAR word at this state. Comparator unit 600 is then clocked for this state <11> by clock generator 500, and the output of the comparator determines whether the MSB-1 bit is kept at value 1 or reset to value 0. The remaining bits of the SAR word, including the intermediate overlap bit, are similarly determined in successive states <10>, . . . , <0> of the SAR logic state machine unit 200. Once the last bit (LSB) is determined, state machine unit 200 returns to the sampling phase, and the next sample of the analog input voltage signal is taken, and the value of $V_{IN}$ accordingly reset for a subsequent conversion phase of processing.

In accordance with certain aspects of the present invention, the timing profile for actuating state machine operation in this manner is selectively configured and controlled. Preferably, the time duration of each individual state during the conversion phase of a processing cycle is optimized, and the relative portion of available processing cycle time devoted to the sampling phase is programmable. SAR ADC timing is optimally maintained thereby in a manner independent of supply voltage, process corner, or temperature.

Figure 2:
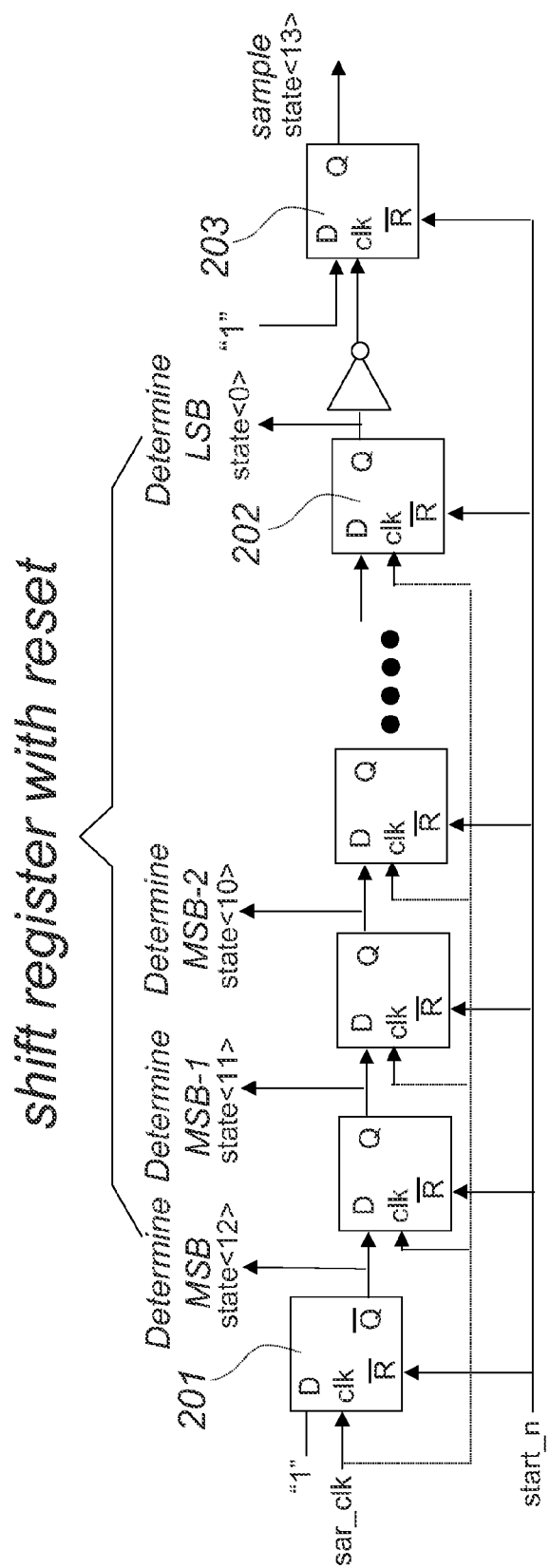
FIG. 2 is a simplified schematic diagram illustrating portions of an exemplary SAR logic state machine unit implementation employed in the embodiment of FIG. 1.
Figure 4:
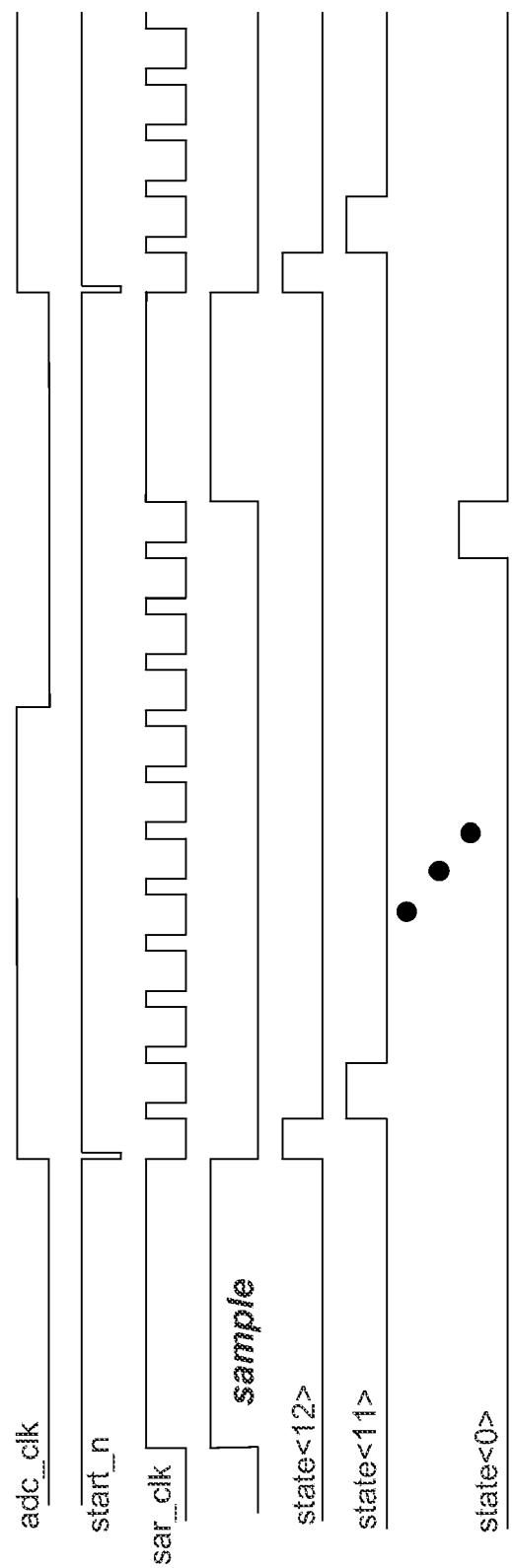
FIG. 4 is an illustrative diagram showing relative positions in time of timing waveforms for various signals generated during representative operation of the system embodiment shown in FIG. 1.

Referring now to FIG. 2, there is shown a simplified schematic diagram illustrating portions of SAR logic state machine unit 200 formed in accordance with an exemplary embodiment of the present invention. FIG. 4 illustrates timing waveforms showing the relative positions in time of the sampling phase (represented by state the sample pulse, or state <13%) and states <12>, . . . , <0% of the bit conversion phase, relative to the input ADC clock signal adc_clk and various other clocking and triggering signals generated by the system based thereon.

Unit 200 in the illustrated embodiment preferably includes a cascaded series of flip-flops 201, 202, 203, each having a reset controlled by a start pulse, denoted in this example by signal start_n, delivered by start pulse generator unit 100. Each of the flip-flops 201, 202, 203 is clocked by the signal sar_clk adaptively generated by clock generator unit 500 (as described in following paragraphs); and, the set of intermediate flip-flops 202 are interconnected in a shift register configuration. The $\overline{Q}$ or Q outputs of the flip-flops 201 and 202 respectively define the states <12%, . . . , <0> of the current processing cycle, while the Q output of flip-flop 203 defines the state <13> (or sampling phase) of the immediately following processing cycle.

The first flip-flop 201 is configured with its D input fixed at a logic "1" value. The next flip-flop 202 is disposed with its D input coupled to the $\overline{Q}$ output of flip-flop 201. Each of the following flip-flops 202 is disposed with its D input coupled to the Q output of the immediately preceding flip-flop 202. Consequently, when all the flip-flops are initially cleared/reset responsive to the start pulse, the $\overline{Q}$ output of the first 201 resets to a logic "1" value. This sets state machine unit 200 in state <12>, whereby the reference DAC of unit 250 is actuated to generate the appropriate reference level for the state. It is against this reference level that the sampled $V_{IN}$ is compared to determine the MSB of the SAR word maintained in the SA register unit 300. When subsequently clocked by the string of adaptively spaced pulses sar_clk, the $\overline{Q}$ output of flip-flop 201 is maintained at a logic "0" value (since its D input remains fixed at the logic "1" value). The effect of this is to shift the initial reset value "1" of the $\overline{Q}$ output of flip-flop 201 (in state <12>) down as a state enabling flag to the next flip-flop 202, with each subsequent state <11>, . . . , <0>, until the lone "1" value is finally shifted to the last flip-flop 202 in the series to actuate determination of the SAR word's LSB.

The Q output of the last state <0> flip flop 202 is inverted to drive a clock input of flip-flop 203, whose D input is fixed at a logic "1" value. Thus, after the Q output of this last flip flop 202 goes low to signify the conclusion of the current processing cycle's state <0>, it clocks flip-flop 203 to set state machine unit 200 in the sampling phase for state <13>) of the next processing cycle. A corresponding sample pulse defined by this state <13> is passed to unit 250 for to actuate the next sampling and holding of the analog input signal. The sample pulse is passed as well to unit 800 for sample duty cycle measurement and control. State machine unit 200 stays in the sampling phase until next external input ADC: clock signal adc_clk arrives and generates a start pulse, whereupon another bit conversion phase is begun for the next cycle of processing.

Figure 3:
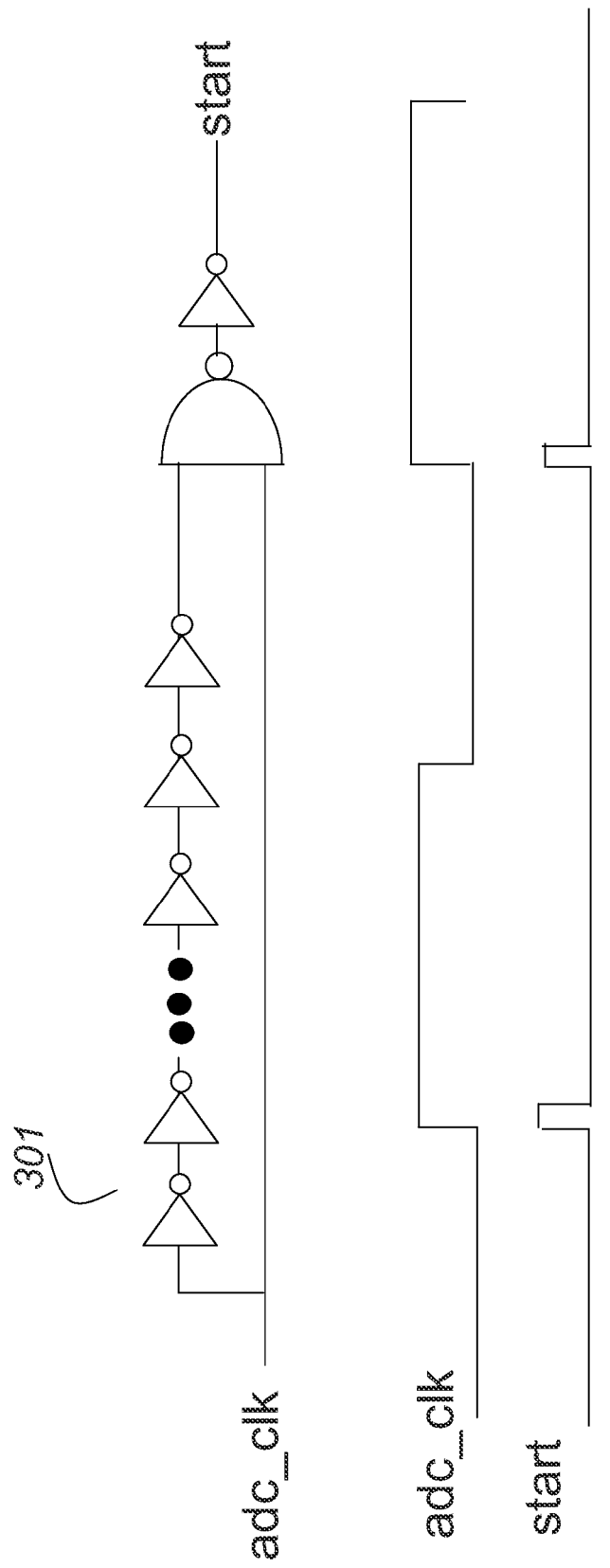
FIG. 3 is a simplified schematic diagram illustrating portions of an exemplary pulse generator unit implementation employed in the embodiment of FIG. 1.

Referring to FIG. 3, there is shown a simplified schematic diagram illustrating portions of start pulse generator unit 100 formed in accordance with an exemplary embodiment of the present invention. Unit 100 preferably includes an edge detector circuit which receives the external input ADC clock signal adc_clk and NAND's the signal with a delayed version of itself. The delayed version is provided by passing the signal through a string of cascaded inverters or buffers 301, such that a narrow pulse is generated. An inverter is applied at the output of the NAND gate to restore a positive polarity of the pulse, start; however, the pulse may be employed in its negative polarity form, start_n, as in the embodiment illustrated in FIGS. 2 and 4. Depending on the requirements of the intended application, the width of this start pulse may be set as needed by varying the number of inverters/buffers in the delay string 301 accordingly. The resulting start pulse triggers actuation of the bit conversion phase from the sample (and hold) phase of ADC processing.

In the illustrated example, the start pulse is generated upon detection of a rising edge in the externally supplied ADC clock signal adc_clk. Suitable measures known in the art may be taken to supply this ADC clock signal adc_clk in such manner that a rising edge switches the system from sample mode to hold mode with minimal timing jitter.

Timing Generation

In accordance with certain aspects of the present invention, the bit conversion states <12>, . . . , <0> output by state machine unit 200 will serve multiple purposes. First, the states serve to control the successive approximation register logic which controls the reference DAC feeding the comparator for determination of each SAR word bit. Additionally, the bit conversion states output by state machine unit 200 serve the auxiliary function of adaptively controlling the timing interval between the clock pulses sar_clk automatically generated by clock generator unit 500. This contributes to the ability provided in accordance with the present invention to adjust both the relative timing of the sample and bit conversion phases and the timing of individual states of hit conversion processing. This in turn affords the flexibility to realize optimal timing for higher speed sampling at lower power.

Figure 5:
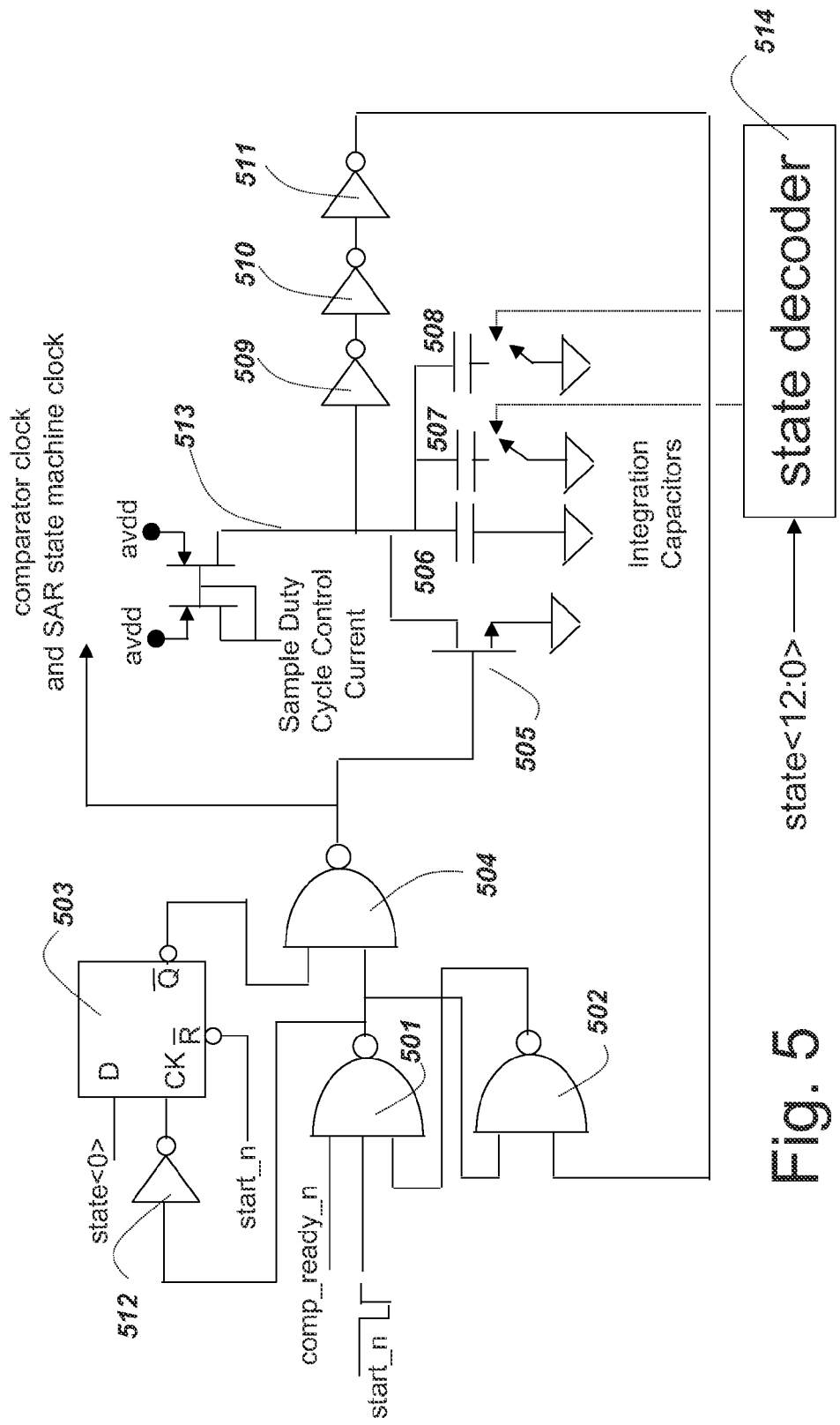
FIG. 5 is a simplified schematic diagram illustrating portions of an exemplary clock generator unit implementation employed in the embodiment of FIG. 1.
Figure 6:
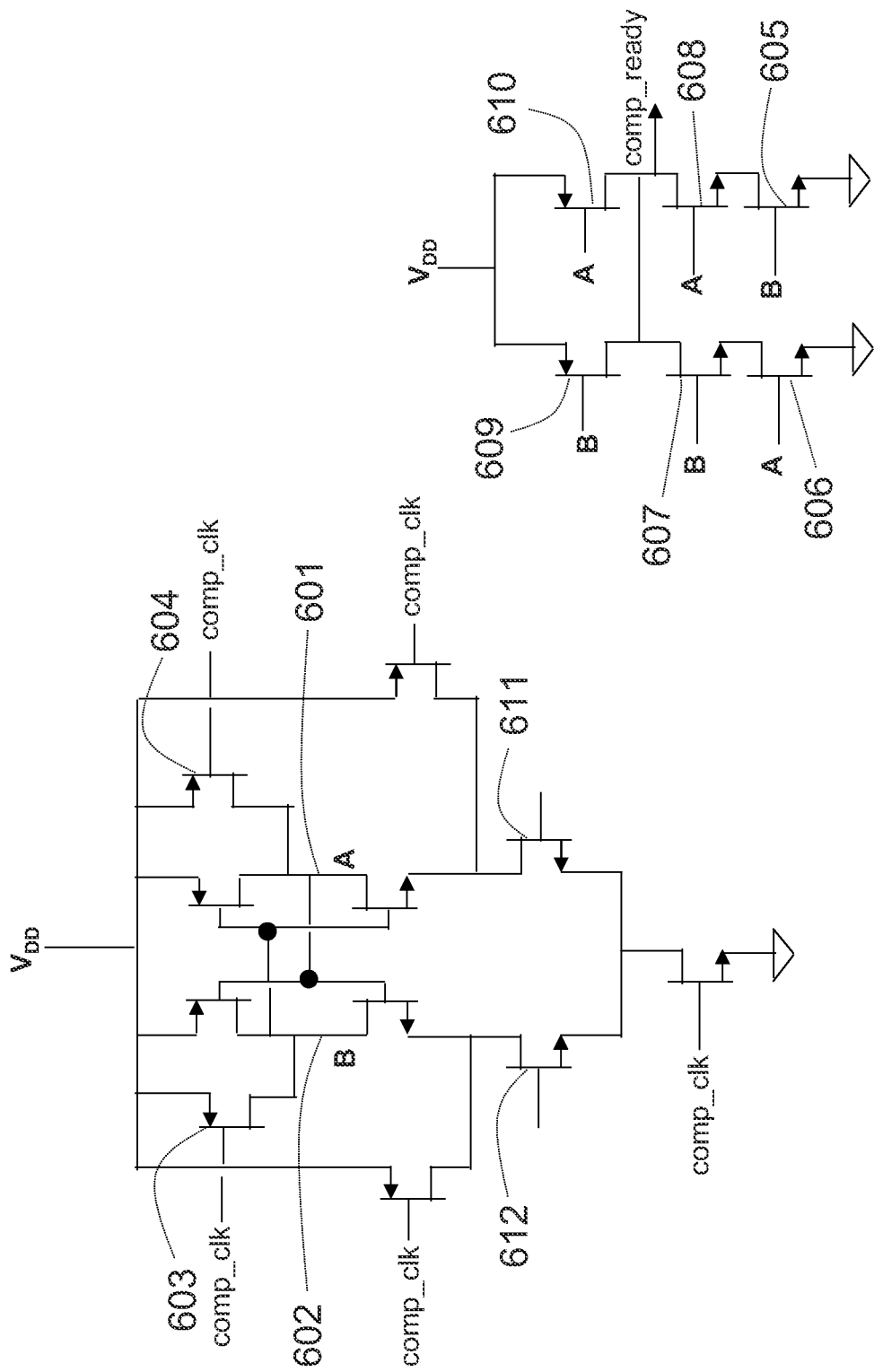
FIG. 6 is a simplified schematic diagram illustrating portions of an exemplary comparator unit implementation employed in the embodiment of FIG. 1.

Turning to clock generator unit 500, FIG. 5 shows a simplified schematic diagram of such generator formed in accordance with one exemplary embodiment of the present inventions. Clock generator unit 500 in this embodiment receives: a start pulse start_n (of inverted polarity in this example) from start pulse generator unit 100; a sample duty cycle control current received from sample duty cycle measurement and control unit 800; and, digital bit conversion states <12>, . . . , <0> (preferably, via state control lines indicated accordingly) from state machine unit 200, which indicate the state of conversion phase processing occurring at a particular instant. Clock generator unit 500 preferably also receives amongst its inputs a comp_ready_n signal from comparator unit 600 which provides an indication of whether or not the requisite comparison for the current bit determination has been completed. From these inputs, unit 500 operates to generate a signal (sar_clk; comp_clk) preferably used to clock both the SAR logic state machine and comparator units 200, 600.

Unit 500 preferably includes a first stage generally defining a clock setting portion and a second stage generally defining an integration portion, both stages being coupled to an output node. The clock setting portion selectively sets and resets the output node between alternative clocking levels, while the integration portion actuates responsive to the different clocking levels. In response to the first clocking level, the integration portion actuates to charge over an integration time to set an integration node. When this integration node reaches a predetermined threshold voltage, a feedback reset signal is generated and passed to the clock setting portion, causing it to reset the output node to the second clocking level. In response to the second clocking level, the integration portion actuates to discharge from the predetermined threshold voltage.

Preferably, the output node of the clock generator unit 500 generates a signal that concurrently defines both state and comparator clocking signals. Also, the unit's integration portion preferably includes a capacitive charging circuit having selectively reconfigurable capacitance, which is coupled in switched manner to the output node.

In the example shown, the first stage is preferably implemented using NAND gates 501 and 502 which together form a simple set/reset latch circuit; a flip-flop 503, inverter 512; and, a NAND gate 504 intercoupled as shown. NAND gate 501 receives at two of its inputs the inverted signals start_n and comp_ready_n. Flip-flop 503 and inverter 512 are disposed between input lines of NAND gate 504. Again, such factors as the polarities of the given input, output, and intermediate signals are determined by the particular requirements of the intended application, and the polar configurations of the logic gates and other devices employed in this unit, as well as in other units of the system (i.e., NAND as opposed to AND, NMOS as opposed to PMOS), are determined consistent with the intended signal polarities.

A timing generation cycle begins with the inverted start pulse start_n driving the output of NAND gate 501 to a logic value "1." The start pulse start_n also resets flip-flop 503 clocked responsive to the output of NAND gate 501 (as inverted by inverter 512). Since flip-flop 503 receives at its D input the state <0> from state machine unit 200, which is low at the beginning of a timing cycle, resetting of flip-flop 503 sets its Q output to a logic value "1." These two high outputs of NAND gate 501 and flip-flop 503 feed the inputs of NAND gate 504, whose output defines the combined sar_clk and comp_clk signals for clocking the state machine and comparator comparatsor units 200, 600. At this state of the timing cycle, the NAND gate 504 output sets responsively to a logic value "0" for output.

The second stage of clock generator unit 500 is preferably implemented in this example using an NMOS device 505 which selectively switches a plurality of integration capacitors 506, 507, 508 for charge or discharge modes of operation; suitable measures for generating an integration current on line 513 (responsive to a sample duty cycle control current received from unit 800); and, a string of inverters 509, 510, 511 feeding back to the first stage. This second stage further includes a programmable state decoder 514 which receives the bit conversion state <12>, ..., <0> and selectively couples and decouples one or more of the integration capacitors 507, 508 for selective control of the integration capacitors effective charge time, during which a hit conversion state's reference DAC (of unit 250) sets the reference evel for bit determination. The effect of such control is to selectively set the integration time duration for each individual state of bit conversion, thereby allowing for more or less time, as needed (under the prevailing conditions of that state), for the reference DAC to settle to the proper level for that state's bit determination comparison.

When the output of NAND gate 504 goes low, NMOS device 505, which had been in its ON state and shorting the integration capacitors 506, 507, and 508 to ground, goes to a high impedance state, or OFF state. The integration capacitors 506, 507, 508 then begin to charge, integrating the control current on line 513. It is during the ensuing integration period, while the integration capacitors 506, 507, 508 are charging, that the reference DAC of unit 250 actuates and settles to the appropriate reference voltage for comparison with the sampled $V_{IN}$. Since the output of NAND gate 504 is low, the combined clocking signals sar_slk and comp_clk defined by this output remain low. This means that comparator unit 600 remains inhibited, and state machine unit 200 remains in its current bit conversion state during the integration period.

The feedback inverter string operates much like a condition-adaptive comparator for the charged voltage on integration capacitors 506, 507, 508. The inverter string presents a logic threshold level at the input of inverter 509, which must be reached before the inverter will transition in logic state. The logic threshold level serves much as a dynamic comparison level which must be reached before the effective comparator (formed by the inverter string 509-511) trips. The comparison level is dynamic in that the logic threshold level—being itself a device-specific parameter—tends to automatically compensate for parametric variations due such device-specific factors as process corners, temperature effects, and the like.

When the voltage on integration capacitors 506, 507, 508 reaches the logic threshold level of the feedback inverter string 509-511, the output of the inverter 511 at the end of the inverter string goes low. This low output feeds back to an input of NAND gate 502, causing its output—which feeds an input of NAND gate 501—to go high. Since the comparator has yet to execute the current state's bit comparison at this point, the comp_ready signal will be low and its inverted comp_ready_n signal high. Likewise, the inverted start pulse start_n would have returned to its high level by this point. The high output of NAND gate 502 thus drives the output of NAND gate 501 to go to v. As a result of the NAND gate 501 output going low, the output of NAND gate 504 is driven high. This high-going output of NAND gate 504 then clocks the state machine and comparator units 200, 600 to actuate. The high-going output of NAND gate 504 is concurrently also applied to the control terminal NMOS transistor 505, causing it to turn ON, which resets the integration capacitors 506, 507, 508 to 0 volts. Preferably, device 505 is of sufficient size to cause a rapid discharge of integration capacitors 506, 507, 508, such that they will be reset and available to integrate again for the next bit conversion state, well before comparator unit 600 has completed its current bit determination.

Comparator unit 600 actuates in response to the high comp_clk clocking signal generated at the output of NAND gate 504. Comparator unit 600 carries out the comparison required for the given state's bit determination over a certain propagation period, then sets the comp_ready signal high. The inverted comp_ready_n signal input into NAND gate 501 then drives the gate's output high again, forcing the output of NAND gate 504—and the clocking signals comp_clk and sar_clk it defines—to return to a low level. This then causes NMOS transistor 505 to turn OFF, which frees the previously cleared integration capacitors 506, 507, 508 to begin integrating again for the next bit conversion state.

The clock generator and comparator units form an operational loop which continues to formulate comp_clk and sar_clk pulses in this manner until the end of the last bit conversion state <0>, during which the SAR word's LSB is determined. When state <0> is high and integration capacitors 506, 507, 508 charge sufficiently to cross the logic threshold of inverter 509, the output of NAND gate 502 is driven high and the output of NAND gate 501 consequently low. This low output of NAND gate 501 then passes through inverter 512 to clock flip-flop 503, which receives the high state <0> at its D input. This forces the $\overline{Q}$ output of flip-flop 503 low, such that the output of NAND gate 504 is held high, keeping the NMOS transistor 5050N and thereby inhibiting the integration of capacitors 506-508. The clock signals comp_clk and sar_clk therefore remain at the high level until the next ode clock input is received, and $V_{IN}$ is again sampled and held for the next processing cycle. Upon the generation of another start-n pulse thereafter, flip-flop 503 is reset, and its $\overline{Q}$ output returns to the high level, freeing the output of NAND gate 504 (and its clock signals comp_clk and say_clk) to go low and allow the timing cycle to progress as before.

Turning next to HG. 6, there is shown a simplified schematic for portions of a latched comparator circuit employed by comparator unit 600 in accordance with one exemplary embodiment of the present invention. When the combined comp_clk and sar_clk clock signal provided at the output of NAND gate 504 in unit 500 goes high, the illustrated comparator circuit of unit 600 is set to a latched state. Conversely, when the combined clock goes low, the comparator circuit is set to an unlatched state, whereby the two nets 601, 602 (collection of electrically connected terminals) are held at a supply voltage $V_{DD}$ preferably by PMOS switches 603, 604.

A high-going transition of the combined comp_clk and sar_clk clock signal causes the two PMOS switches 603, 604 to open (turn OFF), and the circuit assumes a regenerative latch state where both nets 601 and 602 initially start falling from their $V_{DD}$ voltage levels. Depending on input voltages applied at the gate terminals of transistors 611 and 612, then, one of the two nets, 601 or 602, goes high to $V_{DD}$ while other goes low to ground through positive feedback. The comparator circuit output will then be latched.

The two nets 601, 602 are disposed to feed the gate terminals of transistors 605, 606, 607, 608, 609, 610, which together form a NAND gate whose output defines the comparator ready signal comp_ready. The NAND gate arrangement presents a balanced load input to the nets 601 and 602. When either of the nets 601, 602 drops below a threshold of this NAND gate, the gate's output goes high, since one of the PMOS transistors 609, 610 closes, its corresponding NMOS transistors 606, 607 or 605, 608 opens. This sets the comparator ready signal comp_ready which is sent back to the timing generator unit 200 (in inverted form in the example of FIG. 5) to a high level, indicating that the comparator circuit is latched. If neither of the nets 601, 602 drops below a threshold of the NAND gate, the gate's output goes/remains low, since both PMOS transistors 609, 610 are open, and their corresponding NMOS transistors 606, 607 and 605, 608 are closed. This sets the comparator ready signal comp_ready that is sent back to the timing generator unit 200 (again, in inverted form in the example of FIG. 5) to a low level, indicating that the comparator circuit is unlatched.

In accordance with one aspect of the present invention, the disclosed system provides the flexibility to preserve different time intervals between comparator clocks based on the bit conversion state set by state machine unit 200. Referring back to FIG. 5, this time interval is determined by the integration current on line 513, and the sum of the integration capacitance (of capacitors 506-508 for example). One or more of the integration capacitors 507, 508 are therefore preferably switched for selective participation in the integration which occurs in a given state—that is, before a comparator/SAR state machine clock (comp_clk, sar_clk) is generated to actuate a bit determination comparison and bit conversion state transition. Connecting more integration capacitors into the process adds to the effective integration time (for the integration capacitors to charge to the triggering logic threshold level of inverter 509). By selectively adding or removing one or more integration capacitors 507, 508, this integration time—hence the time for the given reference DAC to settle to the appropriate reference level for comparison within a particular bit conversion state—may be adjusted for optimal system performance.

One or more of integration capacitors (such as the capacitors 507, 508 illustrated) may be suitably switched for selective interconnection in parallel with the others. Such interconnection switching is preferably controlled as illustrated by a programmable state decoder 514. State decoder 514 receives the bit conversion states <12>, . . . , <0> from state machine unit 200, and programmably closes/opens the appropriate switches to select the combination of integration capacitors to utilize for a particular bit conversion state. Depending on the particularities of a given application, certain states/SAR word hits may require more or less integration time than others; and, state decoder 514 controls the selective interconnection of integration capacitors accordingly.

While three integration capacitors are shown in the exemplary embodiment illustrated, more or less integration capacitors may be employed depending on how many variations of time delays may be required for a particular application. At the extreme, a different integration capacitance could be switched in for every bit conversion state. This would allow for a unique timing delay between comparator clock pulses for each state. Since this time delay determines the amount of time available for reference DAC settling (in unit 250), the flexibility to set an optimal DAC settling time for each individual bit determination maximizes efficient allocation of available time. Where necessary in practice, it desirable to scale this time interval between comparator clock pulses with the amount of time available for the overall bit conversion phase of an ADC processing cycle. Preferably, the time interval is scaled by the size of the integration current on line 513.

Figure 7:
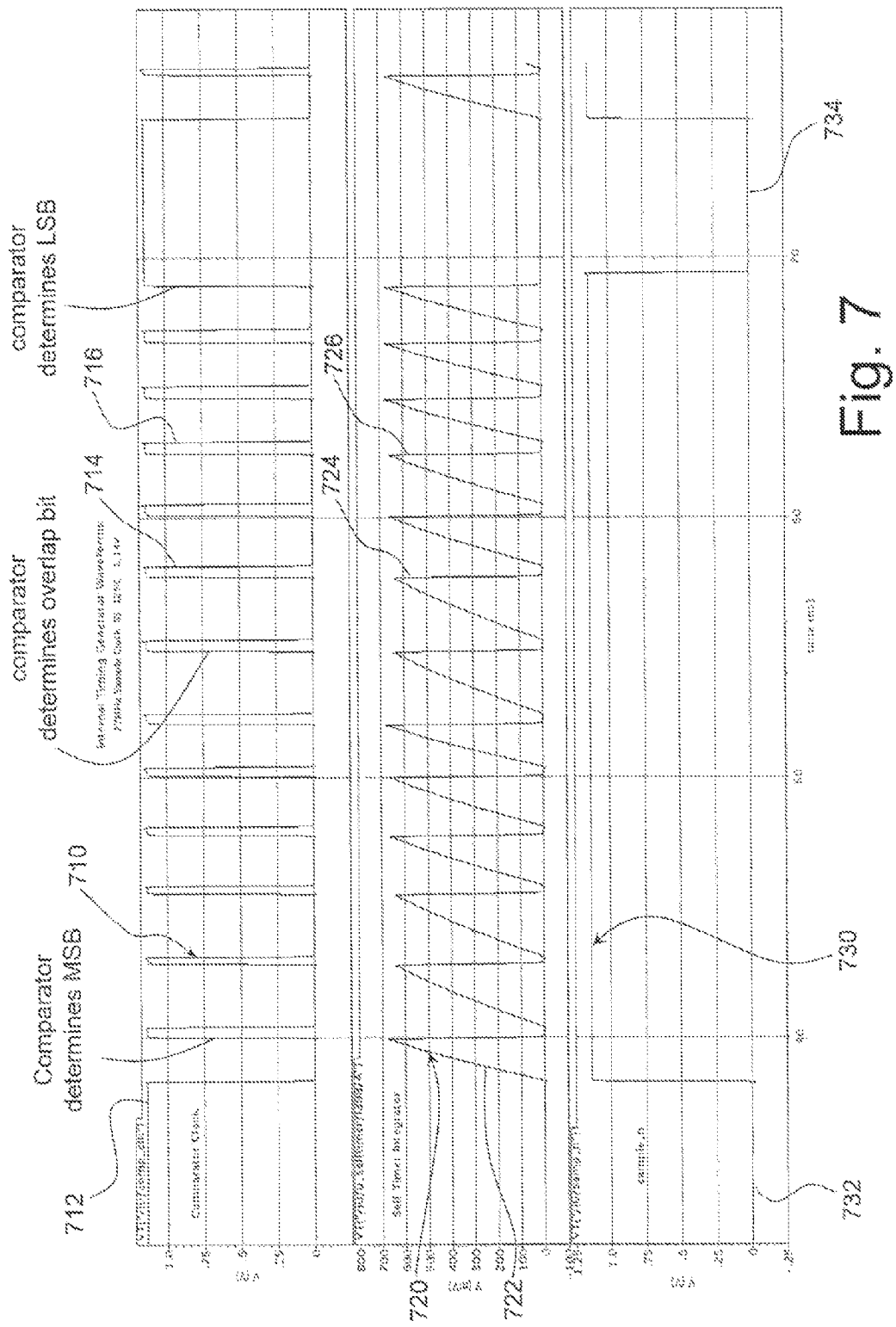
FIGS. 7, 7A-7C are respectively an illustrative diagram and enlarged portions thereof showing time aligned waveform plots generated based on simulated operation of the system embodiment shown in FIG. 1; and, FIG. 8 is a simplified schematic diagram illustrating portions of an exemplary sample duty cycle control unit implementation employed in the embodiment of FIG. 1.
Figure 7A:
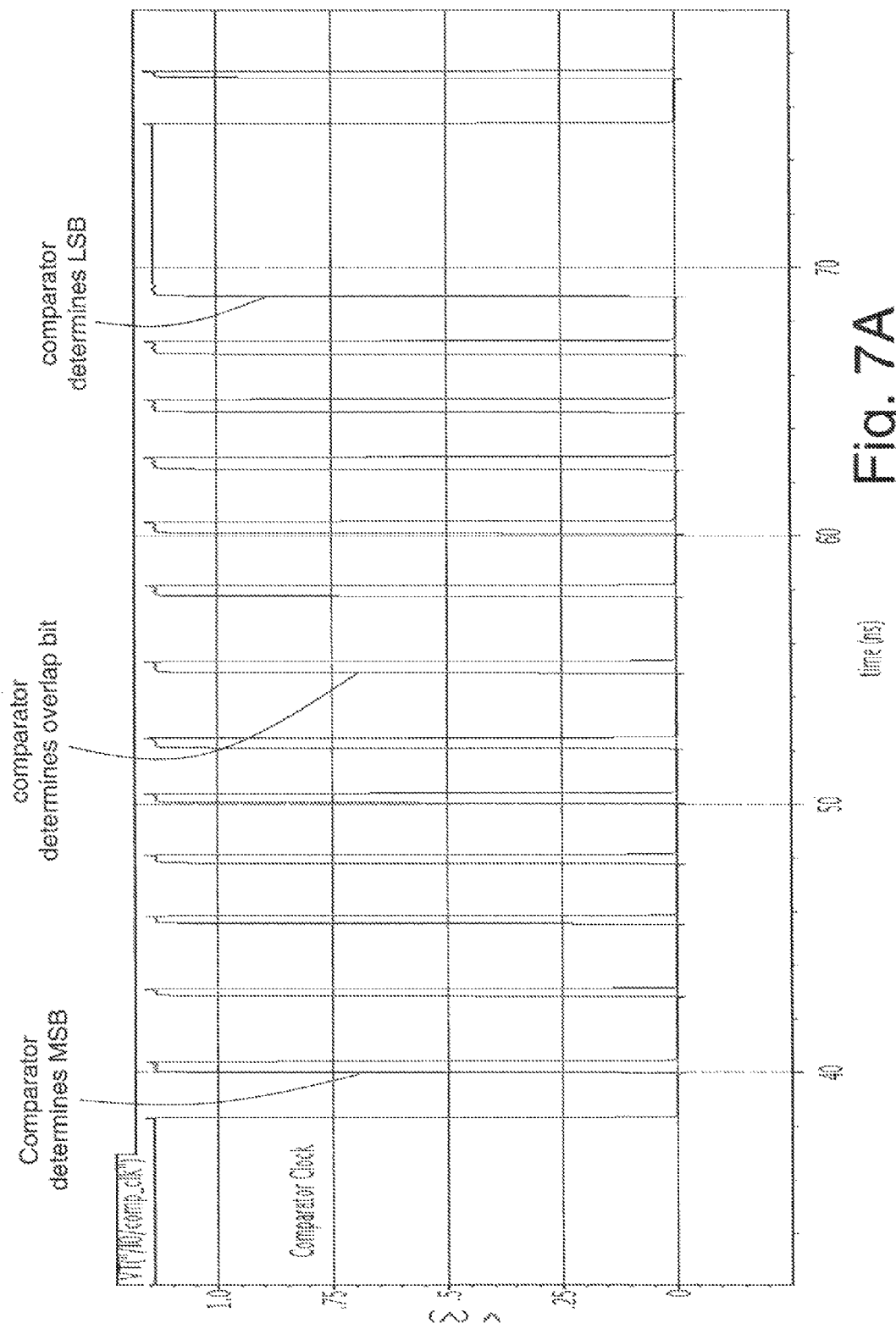
Figure 7B:
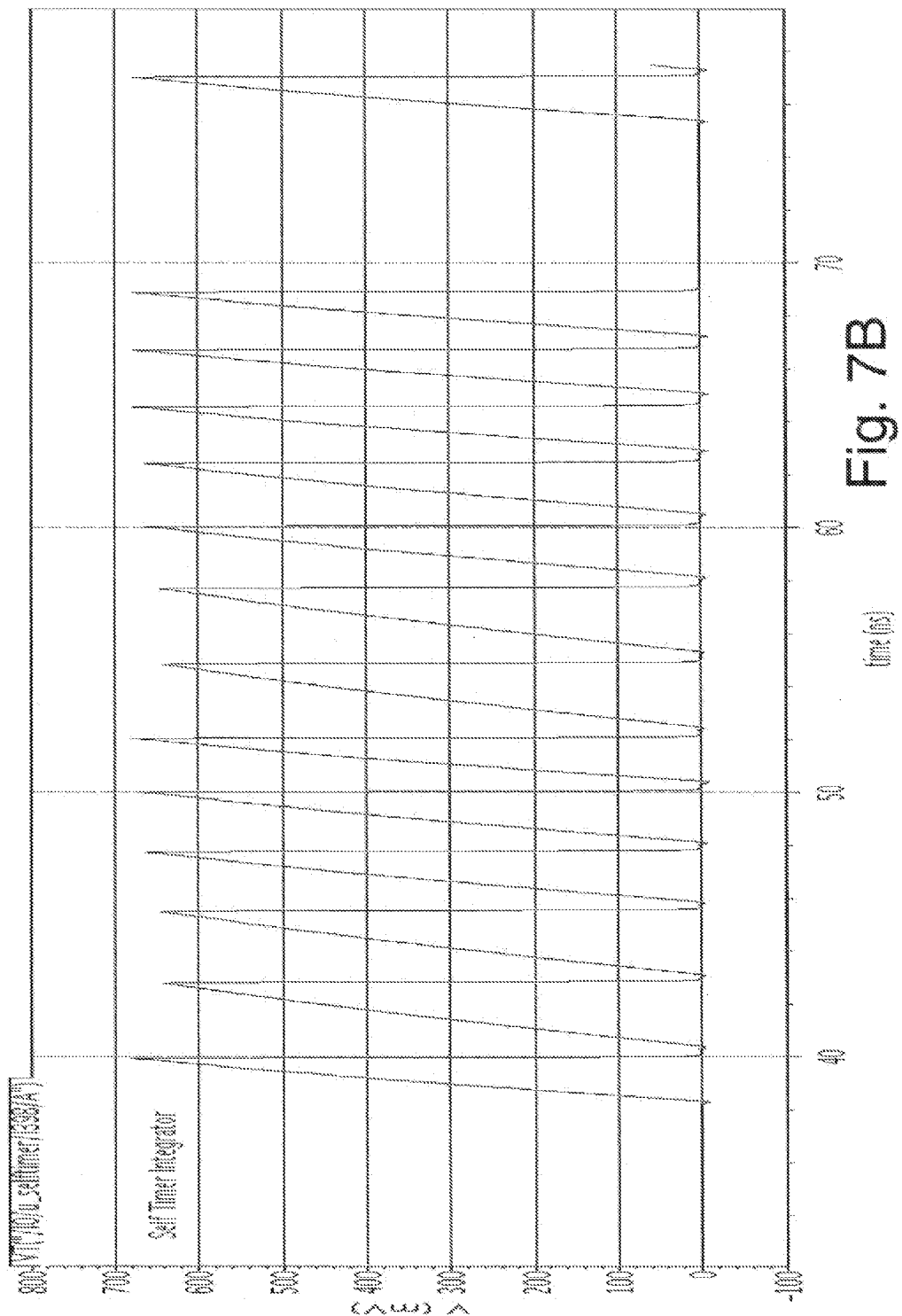
Figure 7C:
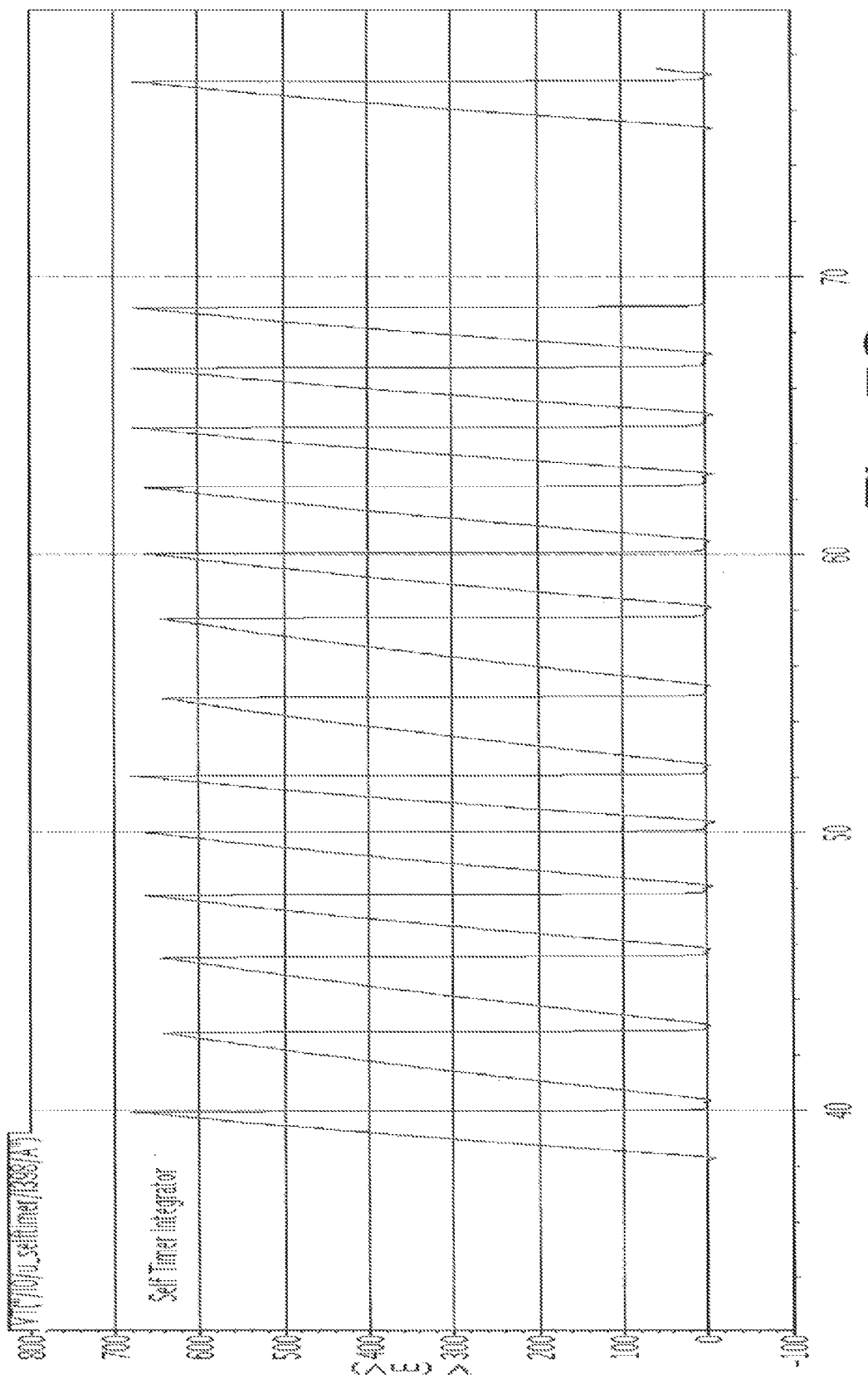

FIG. 7 shows time aligned waveform plots generated based on simulated operation of the disclosed system embodiment for: the combined comparator/SAR state machine clocks 710 (comp_clk, sar_clk); the voltage charge 720 of the integration capacitors; and, a pulsed inverted sample clock, sample_n, 730. FIGS. 7A-7C show enlarged views of these waveform plots 710, 720, 730 in isolation.

Waveform 710 remains high initially at portion 712 during which $V_{IN}$ is sampled (sampling phase of a processing cycle). The sample clock pulse 732 during this period actuates unit 250 to sample and hold Once the appropriate edge of the input ADC clock is detected and the start pulse accordingly triggered, as described in preceding paragraphs, the comparator clock 710 goes low, and the bit conversion phase of the processing cycle is begun. The integration voltage 720 begins to rise at this point, as the integration capacitors charge for the first state of bit determination. The rise continues until the integration voltage 720 reaches a triggering threshold voltage (of inverter 509, for example, in FIG. 5), at which point the comparator clock 710 is caused to go high and the integration capacitors are quickly discharged to ground. This yields a saw tooth shaped waveform profile 722.

Thereafter, the comparator clock 710 remains high for a certain propagation time, while the comparator operation for the given state executes. The requisite propagation time for the comparator operation to complete bit determination tends to vary from bit-to-bit, or state-to-state, during the bit conversion phase. Such is reflected in the differing widths between some or all comparator clock pulses, say between clock pulses 714, 716.

The hit conversion phase ends with the LSB of the SAR word being determined in the last hit conversion state. The comparator clock 710 is not immediately reset to its logic low level after LSB determination as in the preceding states. Instead, the comparator clock 710 is kept high as described in preceding paragraphs, such that further integration of the integration capacitors is inhibited until the next triggering transition 734 of the ADC clock 730 is received to begin another bit conversion phase for the next ADC cycle. In the meantime, the sample clock pulse 734 actuates the sampling phase to obtain the sample $V_{IN}$ of the input analog signal for the next ADC processing cycle.

While the comparator clock 710 remains high, the integration voltage 720 remains discharged. Once the comparator clock 710 transitions to its logic low level, however, the integration voltage 720 once again begins to rise as the integration capacitors start to integrate again. This signifies the start of the next state of bit conversion, with the comparator operation for the preceding state's bit determination having just completed. The process continues for each of the subsequent states, including the overlap hit determination state.

The saw-tooth shaped portions of the integration voltage waveform 720 are selectively varied in width, as mentioned in preceding paragraphs, for optimal use of the time available for the bit conversion phase. This may be controlled from bit-to-bit (or, state-to-state). The differing widths of waveform portions 724, 726, for example, reflect the variation of integration time for the corresponding bit conversion states.

Sample Duty Cycle Control

In accordance with another aspect of the present invention, the duty cycle is measured and controlled, for selective allocation of the overall time available for ADC processing cycle to: sampling the input analog voltage on the one hand, and to bit conversion on the other hand. This control is preferably implemented by automatically setting a control current applied to clock generator unit 500 using a feedback loop to keep the sampling phase time a fixed percentage of the overall processing cycle (defined by the ADC clocking period). Consequently, an optimal ratio of time intervals is maintained between comparator clocks for an arbitrary ADC clock sample rate, supply voltage, temperature, and process corner.

Figure 8:
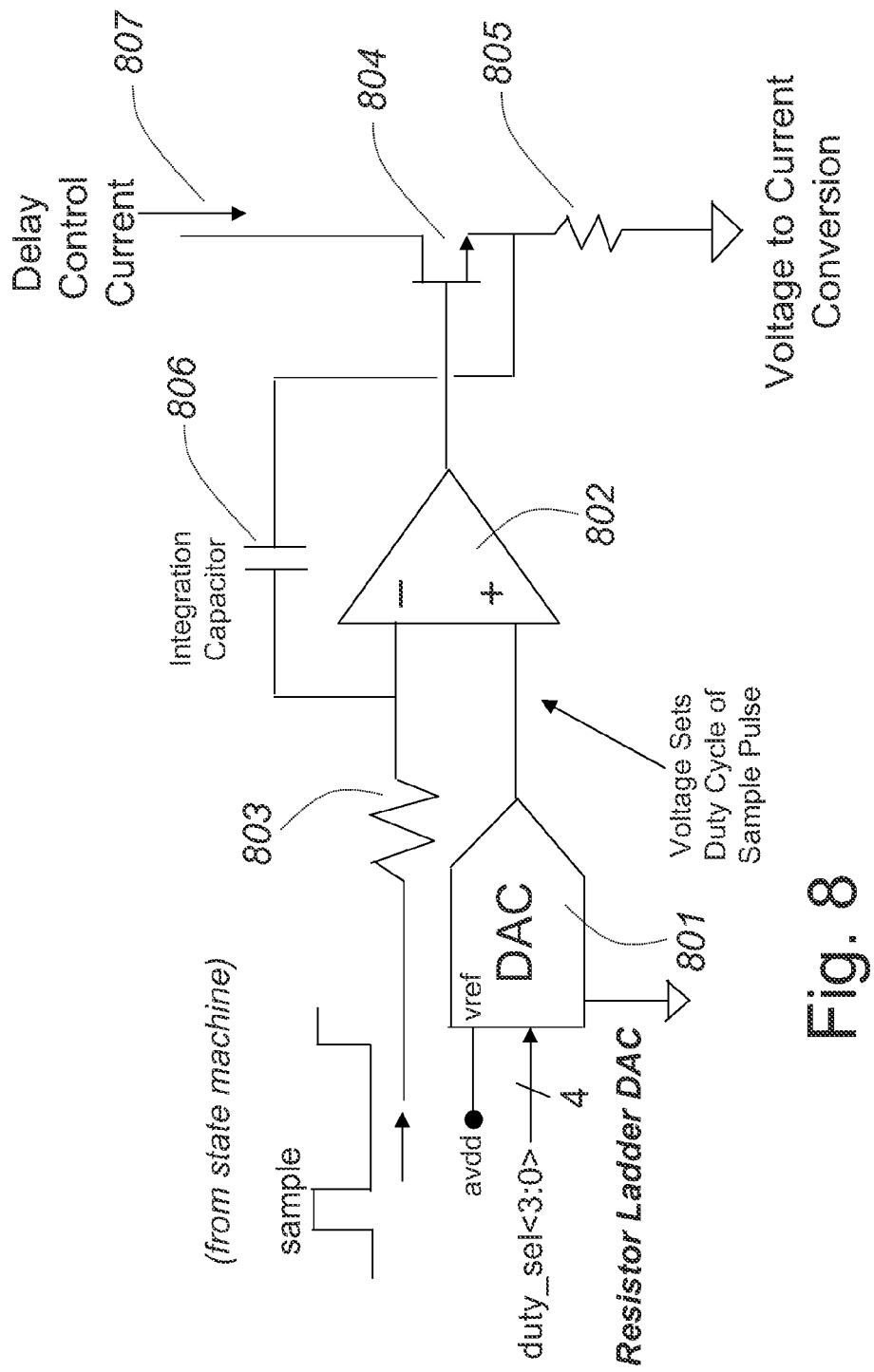

FIG. 8 schematically illustrates portions of a sample duty cycle measurement and control unit 800 formed in accordance with an exemplary embodiment of the present invention. Unit 800 operates to generate a control current based on the desired duty cycle for the sample pulse (an example of which is illustrated in FIG. 4, and in HG. 7 in inverted form). Unit 800 generally includes in this exemplary embodiment an operational amplifier 802 configured as an integrator, with a feedback integrating capacitor 806 and a large input resistor 803 connected to its inverting input. A control DAC 801 is connected to the non-inverting input of operational amplifier 802, and a MOS transistor 804 is connected to the operation amplifier 802 output.

In this configuration, the integrator formed using operational amplifier 802 integrates the difference between the average voltage value over time of the sample pulse (state <13>) received from state machine unit 200 and the output voltage of control DAC 801. The integrated difference appears at the source terminal of the MOS transistor 804 connected to the output of operational amplifier 802. MOS transistor 804 serves to convert the output voltage generated across output resistor 805 to a delay control current 807. This delay control current 807 is then passed to clock generator unit 500 as the sample duty cycle control current in FIG. 5, which controls the integration current resulting on line 513.

Control DAC 801 is preferably formed using a resistor ladder referenced by a power supply voltage avdd and ground. A predetermined digital control word input duty_sel <3:0> preferably selects the tap along such resistor ladder which is to be switched to the output of DAC 801. Since control DAC 801 uses the power supply voltage avdd as a reference, it generates an output voltage that varies proportionally with supply voltage.

This control DAC 801 output voltage is applied to the non-inverting input of operational amplifier 802, and the sample pulse is fed through a large resistor 803, into the inverting input of operational amplifier 802. The output of operational amplifier 802 feeds the gate terminal of MOS transistor 804, whose source terminal is connected through an output resistor 805 to ground. A feedback integrating capacitor 806 is connected from the high potential side of this resistor 805 back to the inverting input of operational amplifier 802.

Since the power supply is used as the voltage reference of control DAC 801, the average value of the sample pulse stream fluctuates with the supply voltage. As the DAC 801 output increases proportionally with the supply voltage, however, the resulting control loop maintains the correct sample pulse duty cycle independent of supply voltage.

If the input ADC clock frequency is either increased or reduced, the sampling state of the state machine will initially change by the same amount of time that the sample period has changed. Over time, the control loop will execute to correspondingly increase or decrease the control current 807 until the sample pulse duty cycle returns to the setting selected by control DAC 801. Similarly, if other factors like temperature changes increase or reduce gate delays in the effective timing loop, the sample clock duty cycle would initially be affected. The control loop will execute to correspondingly increase or decrease the control current 807 until the sample pulse duty cycle returns to the desired value.

In CMOS or other digital applications, the sample pulse assumes either a logic high voltage or a logic low voltage. Typically, the logic high value is set to the system's supply voltage avdcl. The average value of the sample pulse, therefore, reaps directly the sample pulse duty cycle. For example, if the sample pulse is to be held high for 40% of a processing cycle period (or at a 40% duty cycle), the average value of that sample pulse would equal 0.4*avdd, or 40% of the sample pulse's high level voltage. By referencing both DAC 801 to the same supply voltage serving as the sample pulse's high voltage, the operational amplifier integrator of unit 800 forces the output delay control current to the value required to obtain a voltage corresponding to the desired sample pulse duty cycle. Conveniently, this output voltage of control DAC 801 in terms of the supply voltage avdd, scaled in direct proportion to the desired duty cycle. The integration times established by clock generator unit 500 during the bit conversion phase are adaptively scaled responsive to this desired duty cycle (via the output delay control current passed to unit 500).

In accordance with certain other aspects of the present invention, unit 800 automatically adapts to variations in a regeneration time of the latching comparator (of unit 600). When a latching comparator is clocked, the time that the comparator takes to make a decision depends largely on the overdrive occurring at the comparator's input. In a successive approximation ADC, the comparator for most comparator clock cycles experiences a relatively large overdrive (except for occasional clock cycles when the overdrive may be relatively small). By using a comparator_ready signal to actuate the next bit conversion state in the state machine unit 200, the clock generator unit 500 automatically affords more time to those comparator operations requiring more time to make a bit determination decision (longer propagation time). As the SAR ADC runs through its different hit conversion states, then, the period during which the comparator clock remains in its high logic level (comparator clock width) may vary from state to state depending on comparator overdrive.

The result of these variations is that the overall bit conversion phase time—that is, the time required for SAR logic state machine unit 200 to run through all its bit conversion states—will vary a small amount from one ADC processing cycle to the next. These variations are effectively averaged by unit 800 since the control loop executed thereby is normally of low bandwidth compared to the ADC clock. As a result, the control loop of unit 800 sets the average sample period (or average sampling phase), although for any individual bit conversion processing cycle, the sampling phase width typically exhibits some small random variation in time due to the uncertainty of the comparator propagation delay. By suitable configuration of the comparator unit so that its regeneration time constant remains relatively small, and by allocating sufficient time for the sampling phase (to keep the effects of random sample time variation insignificant), the overall loop timing will automatically optimize itself and set the average sampling phase width to preserve the desired percentage of the time available (for an ADC processing cycle) for this sample period.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular applications of elements may be reversed or interposed, all without departing from the spirit or scope of the invention as defined in the appended claims.

What is claimed is:

1. A system for adaptive timing control in successive approximation analog-to-digital conversion of a sampled analog signal within a conversion period comprising:
   a state machine unit operating responsive to a state clocking signal to maintain a set of successive approximation states including at least one sampling state and a plurality of hit conversion states;
   a reference generating unit operably coupled to said state machine unit, said reference generating unit generating a quantization level reference for each of said bit conversion states;
   a comparator unit operably coupled to said state machine and reference generating units, said comparator unit executing responsive to a comparator clocking signal to compare the sampled analog signal with said quantization level reference for determining a bit value for each said bit conversion state; and,
   a clock generator unit operably coupled to said state machine and comparator units, said clock generator unit operating responsive to a triggering signal to adaptively define said state and comparator clocking signals for each of said successive approximation states, said clock generator unit thereby adaptively delaying execution of said comparator unit in each said bit conversion state until said reference generating unit substantially completes generation of said quantization level reference therefor.

2. The system as recited in claim 1, wherein said clock generator unit includes a clock setting portion and an integration portion each coupled to an output node, wherein:
   said clock setting portion selectively sets and resets said output node between first and second alternative clocking levels;
   said integration portion actuates responsive to said first clocking level to charge over an integration time to set an integration node to a predetermined threshold voltage, whereupon a feedback reset signal is generated to said clock setting portion for resetting of said output node to said second clocking level; and,
   said integration portion actuates responsive to said second clocking level to discharge from said predetermined threshold voltage.

3. The system as recited in claim 2, wherein said output node of said clock generator unit concurrently defines said state and comparator clocking signals.

4. The system as recited in claim 3, wherein said integration portion of said clock generator unit includes a capacitive charging circuit having reconfigurable capacitance coupled in switched manner to said output node.

5. The system as recited in claim 4, wherein said integration portion of said clock generator unit includes:
   a switching device having a control terminal coupled to said output node;
   integration current source coupled to said integration node; and,
   a set of integration capacitors coupled to said integration node, and connected in parallel across a conduction path defined by said switching device, at least one of said integration capacitors being selectively enabled.

6. The system as recited in claim 5, wherein said integration portion of said clock generator unit includes a feedback path extending from said integration node to said clock setting portion of said clock generator unit; said feedback path including at least one inverter, a characteristic logic threshold voltage of said inverter defining said predetermined threshold voltage.

7. The system as recited in claim 4, wherein said clock generator unit includes a state decoder coupled to adjustably reconfigure said capacitive charging circuit in capacitance according to said bit conversion state set by said state machine unit.

8. The system as recited in claim 3, wherein said clock setting portion of said clock generator unit includes:
   a latching circuit configured to detect said triggering signal, said feedback rest signal of said integration portion, and a readiness indication signal from said comparator unit;
   a sample enabling circuit configured to detect a final one of said bit conversion states; and,
   a gating device generating one of said first and second clocking levels for said output node based on the detections of said latching and sample enabling circuits.

9. The system as recited in claim 8, wherein:
   said latching circuit of said clock setting portion includes cross-coupled first and second NAND gates; said first NAND gate having input terminals coupled to receive said triggering and readiness indication signals and an output of said second NAND gate; said second NAND gate having input terminals coupled to receive said feedback rest signal and an output of said first NAND gate; and,
   said sample enabling circuit includes a D having a D input terminal coupled to receive a least significant bit conversion state from said state machine unit, a reset input terminal coupled to receive said triggering signal, and a clocking input terminal driven responsive to said output of said first NAND gate of said latching circuit.

10. The system as recited in claim 2, further comprising a sample duty cycle control unit operably coupled to said state machine and clock generator units, said sample duty cycle control unit operating to selectively set a sample duty cycle for proportionate allocation of time within the conversion period exclusively to said sampling state, said sample duty cycle control unit setting an integration current at said integration node of said current generator unit according to said sample duty cycle.

11. The system as recited in claim 10, wherein said sample duty cycle control unit includes:
   a selection portion having a control digital-to-analog converter (DAC) coupled to a supply voltage reference, said control DAC generating a control voltage as a scaled portion of the supply voltage reference according to a digital duty cycle selection input;
   an integrator portion having an operational amplifier receiving said control voltage at a non-inverting input terminal thereof, and a sample pulse signal generated by said state machine at an inverting input thereof; and,
   a control current portion coupled to an output terminal of said operational amplifier, said control current portion converting a voltage output of said operational amplifier to a delay control current for controlling an integration current at said integration node of said clock generator unit integration portion.

12. The system as recited in claim 1, further comprising a start pulse generator unit generating said triggering signal responsive to an input conversion clocking signal, said start pulse generator including an edge detection circuit for detecting a predetermined transition of said input conversion signal.

13. The system as recited in claim 1, wherein said state machine unit includes a plurality of resettable flip-flops each corresponding to one of said successive approximation states, said resettable flip-flops being connected to serially shift a state enabling flag therebetween responsive to said state clocking signal, said resettable flops being reset responsive to said triggering signal; whereby said state machine unit sequentially updates said successive approximation states.

14. The system as recited in claim 13, wherein said state machine unit generates a state pulse signal corresponding to actuation of each said successive approximation states, at least one of said state pulse signals representing a sample pulse corresponding to said sampling state.

15. A system for adaptive timing control in successive approximation analog-to-digital conversion of a sampled analog signal within a conversion period comprising:
   a state machine unit maintaining a set of successive approximation states including at least one sampling state and a plurality of bit conversion states, said state machine unit updating said successive approximation states responsive to a triggering signal and a state clocking signal;
   a reference generating unit operably coupled to said state machine unit, said reference generating unit generating a quantization level reference for each of said bit conversion states;
   a comparator unit operably coupled to said state machine and reference generating units, said comparator unit executing responsive to a comparator clocking signal to compare the sampled analog signal with said quantization level reference for determining a hit value for each said bit conversion state;
   a clock generator unit operably coupled to said state machine and comparator units, said clock generator unit actuating a processing cycle responsive to said triggering signal, wherein said clock generator unit in said processing cycle adaptively defines said state and comparator clocking signals for each of said successive approximation states, said clock generator unit thereby adaptively delaying execution of said comparator unit in each said bit conversion state until said reference generating unit substantially completes generation of said quantization level reference therefore; and,
   a sample duty cycle control unit operably coupled to said state machine and clock generator units, said sample duty cycle control unit operating to selectively set a sample duty cycle for proportionate allocation of time within the conversion period exclusively to said sampling state, said sample duty cycle control unit setting an integration current of said current generator unit according to said sample duty cycle for scaling said state and comparator clocking signals adaptively defined thereby.

16. The system as recited in claim 15, wherein said clock generator unit concurrently defines said state and comparator clocking signals; said clock generator unit including:
   a clock setting portion operable to selectively set and reset an output node between first and second alternative clocking levels; and,
   an integration portion actuating responsive to said first clocking level to charge over an integration time to set an integration node to a predetermined threshold voltage, whereupon a feedback reset signal is generated to said clock setting portion for resetting said output node to said second clocking level;
   said integration portion actuates responsive to said second clocking level to discharge from said predetermined threshold voltage.

17. The system as recited in claim 16, wherein said sample duty cycle control unit includes:
   a selection portion having a control digital-to-analog converter (DAC) coupled to a supply voltage reference, said control DAC generating a control voltage as a scaled portion of the supply voltage reference according to a digital duty cycle selection input;
   an integrator portion having an operational amplifier receiving said control voltage at a non-inverting input terminal thereof, and a sample pulse signal generated by said state machine at an inverting input thereof; and,
   a control current portion coupled to an output terminal of said operational amplifier, said control current portion converting a voltage output of said operational amplifier to a delay control current for controlling an integration current at said integration node of said clock generator unit integration portion.

18. The system as recited in claim 17, wherein said state machine unit includes a plurality of resettable flip-flops each corresponding to one of said successive approximation states, said resettable flip-flops being connected to serially shift a state enabling flag therebetween responsive to said state clocking signal, said resettable flip-flops being reset responsive to said triggering signal; whereby said state machine unit sequentially updates said successive approximation states.

19. The system as recited in claim 18, wherein said integration portion of said clock generator unit includes:
   a switching device having a control terminal coupled to said output node;
   integration current source coupled to said integration node;
   a set of integration capacitors coupled to said integration node, and connected in parallel across a conduction path defined by said switching device, at least one of said integration capacitors being selectively enabled; and,
   a feedback path extending from said integration node to said clock setting portion of said clock generator unit; said feedback path including at least one inverter, characteristic logic threshold voltage of said inverter defining said predetermined threshold voltage.

20. The system as recited in claim 19, wherein said clock setting portion of said clock generator unit includes:
   a latching circuit configured to detect said triggering signal, said feedback rest signal of said integration portion, and a readiness indication signal from said comparator unit;
   a sample enabling circuit configured to detect a final one of said bit conversion states; and,
   a gating device generating one of said first and second clocking levels for said output node based on the detections of said latching and sample enabling circuits.

21. A system for adaptively controlling timing in successive approximation analog-to-digital conversion of a sampled analog signal within a conversion period comprising:
   a state machine unit operating responsive to a state clocking signal to maintain a set of successive approximation states responsive to a state clocking signal, said successive approximation states including at least one sampling state and a plurality of bit conversion states;
   a reference generating unit operably coupled to said state machine unit, said reference generating unit generating a quantization level reference for each of said bit conversion states within a parametric settling time thereof;
   a comparator unit operably coupled to said state machine and reference generating units, said comparator unit executing responsive to a comparator clocking signal to compare the sampled analog signal with said quantization level reference for determining a bit value for each said hit conversion state over a para etric propagation time; and, a clock generator unit operably coupled to said state machine and comparator units, said clock generator unit operating responsive to said triggering signal to adaptively define said state and comparator clocking signals for each of said successive approximation states, said clock generator including mutually responsive integration and clock setting portions, wherein:

said reconfigurable integration portion selectively delays execution of said comparator comparison in each said bit conversion state by an integration period not less than said parametric settling time; and, said clock setting portion adaptively delays generation of said quantization level reference for a next of said bit conversion states by a regeneration period of not less than said parametric propagation time following a current one of said bit conversion states.

22. The system as recited in claim 21, further comprising a sample duty cycle control unit coupled to said state machine and clock generator units for adjustably actuating said clock generator to selectively set a duty cycle defining a relative portion of the conversion period allocated to said sampling state.

23. The system as recited in claim 22, wherein said sample duty cycle control unit selectively sets an integration current of said clock generator unit, said clock generator unit thereby adjustably scaling said integration period defined for each of said bit conversion states.

24. A method for adaptively controlling timing in successive approximation analog-to-digital conversion of a sampled analog signal within a conversion period comprising:

executing a state machine to initialize and update a set of successive approximation states responsive to a triggering signal and a state clocking signal, said successive approximation states including at least one sampling state and a plurality of bit conversion states;

executing a reference generator to generate a quantization level reference for each of said bit conversion states within a parametric settling time thereof;

executing a comparator responsive to a comparator clocking signal to compare the sampled analog signal with said quantization level reference for determining a bit value for each said bit conversion state over a parametric propagation time; and, executing a clock generator responsive to said triggering signal to adaptively define said state and comparator clocking signals for each of said successive approximation states, said clock generator thereby adaptively delaying execution of said comparator comparison in each said bit conversion state by an integration period not less than said parametric settling time, and adaptively delaying generation of said quantization level reference for a next of said hit conversion states by a regeneration period of not less than said parametric propagation time following a current one of said bit conversion states.

25. The method as recited in claim 24, wherein said clock generator is adjusted over said successive approximation states to selectively define said integration period for at least one of said bit conversion states.

26. The method as recited in claim 25, wherein said clock generator is programmably reconfigured over said successive approximation states to selectively define said integration period for each of said bit conversion states.

27. The method as recited in claim 24, further comprising sample duty cycle control for adjustably actuating said clock generator to selectively set a duty cycle defining a relative portion of the conversion period allocated to said sampling state.

28. The method as recited in claim 27, wherein said sample duty cycle control includes adjustably scaling said integration period defined for each of said bit conversion states.

* * * * *

UNITED STATES PATENT AND TRADEMARK OFFICE
CERTIFICATE OF CORRECTION

| | | |
|---|---|---|
| PATENT NO. | : 8,344,925 B1 | Page 1 of 1 |
| APPLICATION NO. | : 13/116497 | |
| DATED | : January 1, 2013 | |
| INVENTOR(S) | : William Pierce Evans | |

It is certified that error appears in the above-identified patent and that said Letters Patent is hereby corrected as shown below:

Col. 15, Line 11 replace "hit" with --bit--;
Col. 16, Line 29 insert --flip flop-- after "includes a D";
Col. 17, Line 4 insert --flip-- after "said resettable";
Col. 17, Line 30 replace "hit" with --bit--;
Col. 18, Line 38 insert --a-- after "at least one inverter,";
Col. 19, Line 2 replace "para etric" with --parametric--;
Col. 20, Line 17 replace "hit" with --bit--.

Signed and Sealed this
Fifth Day of March, 2013

Teresa Stanek Rea
*Acting Director of the United States Patent and Trademark Office*